United States Patent [19]

Urushima

[11] Patent Number: 5,686,757

[45] Date of Patent: Nov. 11, 1997

[54] FILM CARRIER TAPE FOR USE IN TAPE AUTOMATED BONDING

[75] Inventor: Michitaka Urushima, Tokyo, Japan

[73] Assignee: NEC Corporation, Tokyo, Japan

[21] Appl. No.: 364,551

[22] Filed: Dec. 27, 1994

[30] Foreign Application Priority Data

Dec. 28, 1993 [JP] Japan ................................. 5-338593

[51] Int. Cl.[6] ................................................ H01L 23/495
[52] U.S. Cl. ........................... 257/668; 257/669; 257/672
[58] Field of Search ................................ 257/668, 669, 257/672, 674, 787

[56] References Cited

U.S. PATENT DOCUMENTS 4,918,511  4/1990  Brown ..................................... 257/676
5,153,708  10/1992  Ohikata et al. .
5,243,141  9/1993  Yonehara ................................. 257/668
5,289,032  2/1994  Higgins, III et al. .................... 257/669

FOREIGN PATENT DOCUMENTS 0 627 766  12/1994  European Pat. Off. .
1-315150  12/1989  Japan .
  289349   3/1990  Japan .
 4-34958   2/1992  Japan ..................................... 257/787

Primary Examiner—Mahshid D. Saadat
Assistant Examiner—Jhihan B. Clark

[57] ABSTRACT

A film carrier tape for use in TAB, having a lead wiring of a desired shape, and formed on a base film having a sprocket hole for conveyance and positioning, for connecting electrode pads of a semiconductor chip, includes a corner slit formed in at least one portion of four corner portions of a suspender positioned between a device hole and outer lead holes so as to vertically communicate.

7 Claims, 6 Drawing Sheets

FIG. IA
PRIOR ART
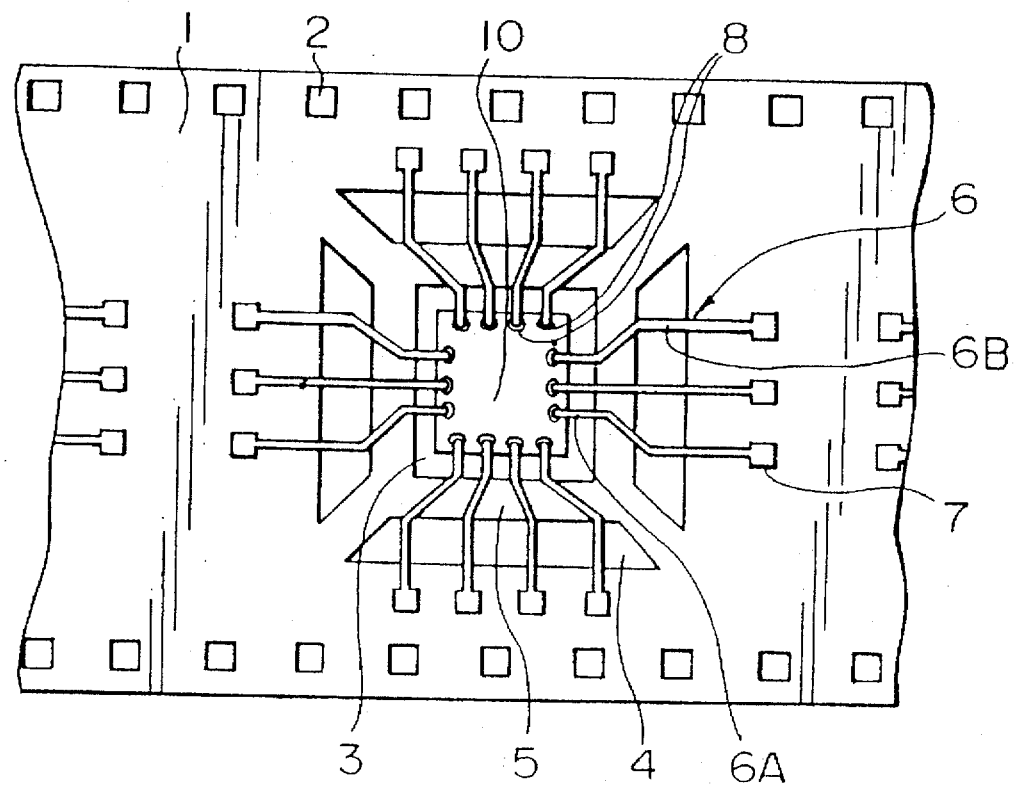
FIG. IB
PRIOR ART
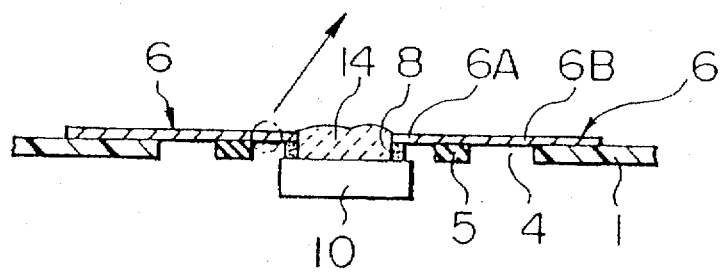
FIG. IC
PRIOR ART
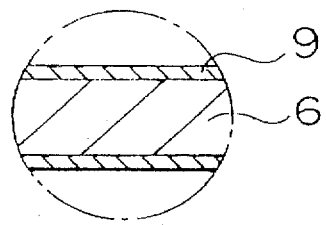

FILM CARRIER TAPE FOR USE IN TAPE AUTOMATED BONDING

BACKGROUND OF THE INVENTION

1. Field of the Invention

The present invention relates to a film carrier tape for use in TAB (Tape Automated Bonding) in a tape carrier package semiconductor device and, more particularly, to the shape of a film carrier tape for use in TAB.

2. Description of the Prior Art

As shown in FIGS. 1A and 1C, a film carrier tape used for a conventional tape carrier package semiconductor device comprises sprocket holes 2 for conveyance and positioning, a device hole 3 as an opening for joining a semiconductor chip 10, and a base film 1 consisting of polyimide or the like and having outer lead holes 4 formed in outer leads 6B portions which are joined to a printed board or the like. A metal foil such as a copper foil is bonded on the base film 1, and the bonded metal foil is selectively etched by the photolithographic technique to form leads 6 having a desired shape, test pads 7 for electrical selection, and the like. Part of the base film 1 between the device hole 3 and the outer lead holes 4 of the film carrier tape is called a suspender 5. The area of the suspender 5 and lead wiring on the suspender 5 are determined depending on a distance (called a package size) from the edge of one outer lead hole 4 to that of the opposite outer lead hole 4, and the size of the device hole 3 which changes depending on the size of the semiconductor chip 10. The presence of the suspender 5 makes it possible to determine the lead wiring on the suspender 5. Since the leads 6 are fixed on the suspender 5 due to the presence of the suspender 5, the leads are prevented from bending and the like, thus allowing a complicated wiring. In order to facilitate etching of the leads 6 on the base film 1, the lead wiring is formed over a maximum range such that the line width of the lead wiring is maximized, and the lead pitch is set coarsely.

In assembly using this film carrier tape, as shown in FIG. 1B, bumps 8 formed on each semiconductor chip 10 are joined to inner leads 6A, respectively. The semiconductor chip 10 is covered with a resin 14 by the potting method for the sake of protection..

However, when a resin is to seal a tape carrier package by the transfer mold method in the same manner as in a normal plastic package, the resin is often injected from any one of upper and lower sides of the film carrier tape, which is described with reference to FIG. 2, as disclosed in Japanese Unexamined Patent Publication No. 2-89349. For this reason, a mold slit 13 as a through hole for passing the resin is formed at the resin injection portion side.

As shown in FIG. 3, after the bumps 8 on each semiconductor chip 10 are connected to the inner leads 6A, respectively, the leads are cut off at the outer lead holes 4, and the resultant structure is fixed on a lead frame die pad 15' using a paste 16 to join inner lead portions 6A' of a lead frame 15 to the outer leads 6B. When the resultant structure is to be sealed with a sealing resin 17 by the transfer mold method, resin sealing is performed from one or both of the upper and lower sides of the film carrier package. This package is called "TAB in QFP" (Tape Automated Bonding in Quad Flat Package).

When the transfer mold method is to be performed using the above conventional film carrier tape, resin sealing is performed from one or both of the upper and lower sides. However, the structures of the upper and lower sides are different from each other, and in addition the injection rates of the resin from the upper and lower sides are different from each other due to the presence of the base film 1, undesirably generating portions which are not filled with the resin upon sealing, and defects called voids as bubbles on the surface of the resultant structure. The inner leads 6A of the leads on the sinking suspender 5 touch the edge portions of the semiconductor chip 10 to cause short-circuiting, and peeling undesirably occurs (at inner lead bonding portions) by vertical movement of the suspender 5 between the inner leads 6A and electrodes of the semiconductor chip 10 which are joined to each other. In addition, the inner leads 6A are erroneously cut off. When the tape is to be cut off or the leads are joined to the semiconductor chip at the outer lead holes 4 during the TAB in QFP manufacturing process, the suspender 5 is deformed to cause inner lead bonding portions to peel, and to erroneously disconnect the leads.

SUMMARY OF THE INVENTION

The present invention has been made to solve the above problems, and has as its object to provide a film carrier tape which is made to suppress sinking of a suspender generated in resin sealing, and formation of voids upon molding, and is free from tape defects such as peeling of joint portions and disconnection of leads.

In order to achieve the above object, according to the first aspect of the present invention, there is provided a film carrier tape for use in TAB, having a lead wiring of a desired shape, and formed on a base film having a sprocket hole for conveyance and positioning, for connecting electrode pads of a semiconductor chip, comprising a corner slit formed in at least one of four corner portions of a suspender positioned between device hole and outer lead holes so as to vertically communicate.

According to the second aspect of the present invention, there is provided a film carrier tape wherein the lead wiring extending from the device hole to each of the outer lead holes is formed in a range of at least ⅓ a width of the suspender, i.e., a distance between the device hole and each outer hole at the same pitch as that of the electrode pads of the semiconductor chip, and the corner slit described in the first aspect has a heart-like shape to enlarge the corner slit from a sprocket hole side toward a device hole side.

In the film carrier tape described in the first or second aspect, a side slit is formed under the lead wiring on the suspender.

In resin sealing using the film carrier tape described in the first or second aspect, if a total area of the corner slit is not less than 3% an area of an outer shape of a mold upon resin sealing, the conventional problems can be effectively solved.

In a package obtained such that, after each electrode pad of a semiconductor chip is joined to a corresponding inner lead of the film carrier tape, a lead wiring is cut off at outer lead portions, the resultant structure is mounted on a die pad of a lead frame, each outer lead is joined to a corresponding inner lead of the lead frame, and resin sealing is performed, the corner slit is positioned outside (an outer hole side) the area of the die pad of the lead frame when viewed from the top, thereby enhancing the effect.

Similarly, in a package obtained such that, after each electrode pad of a semiconductor chip is joined to a corresponding inner lead of the film carrier tape, the lower surface of the semiconductor chip is mounted on a metal plate, and resin sealing is performed, the corner slit of the present invention is positioned outside (an outer hole side) the area of the outer shape of the metal frame when viewed from the top.

The corner slit further has the following characteristic features.

The shape of a heart-like corner slit at the device hole side is formed similar to the shape of the device hole, and the shape of the side of the corner slit is formed parallel to a pattern wired from the inner leads to the outer leads.

Depending on conditions, the corner slit is formed integrally with the device hole.

As described above, according to the present invention, since the corner slit having a desired shape is formed in part of the suspender of the film carrier tape, sinking of the suspender in resin sealing, and formation of voids on the surface upon molding can be suppressed, realizing high-yield manufacturing. Manufacturing can also be performed without causing errors such as peeling of the joint portion and disconnection of the leads which are caused in a step of joining each outer lead to a substrate or the corresponding inner lead of the lead frame.

The above and many other advantages, features and additional objects of the present invention will become manifest to those versed in the art upon making reference to the following detailed description and accompanying drawings in which preferred embodiments incorporating the principles of the present invention are shown by way of illustrative example.

BRIEF DESCRIPTION OF THE DRAWINGS

FIGS. 1A–1C are a schematic plan view and a sectional view, respectively, showing a prior art;

FIGS. 4A and 4B are schematic plan views showing the first embodiment of the present invention, in which FIG. 4A shows the overall structure, and FIG. 4B shows a partial enlarged portion;

DETAILED DESCRIPTION OF PREFERRED EMBODIMENTS

The present invention will be described below with reference to the accompanying drawings (FIG. 4A to FIG. 8).

Figure 2:
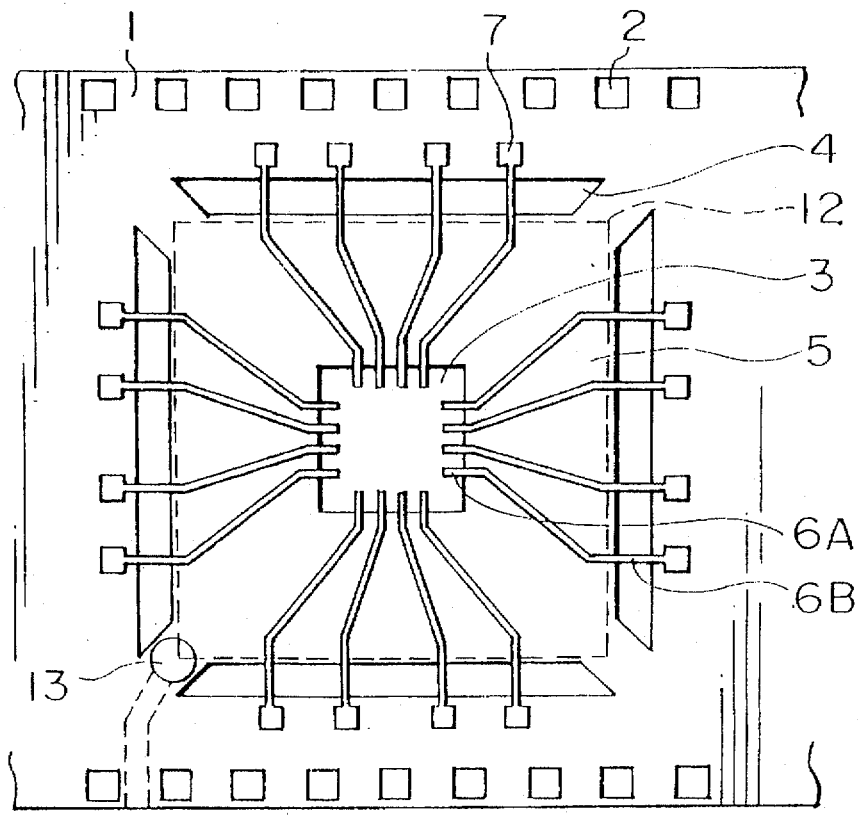
FIG. 2 is a schematic plan view showing another prior art.
Figure 3:
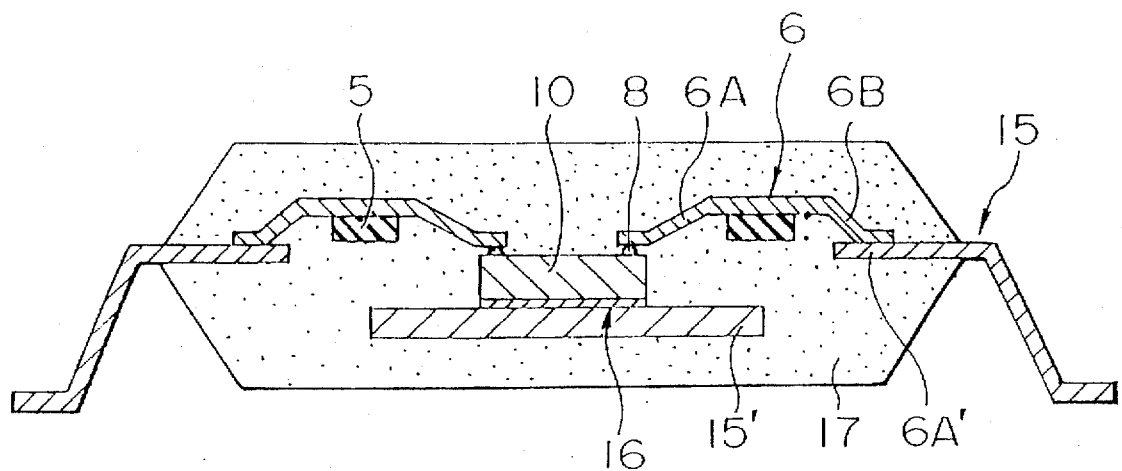
FIG. 3 is a sectional view showing the structure of a conventional TAB in QFP.
Figure 4A:
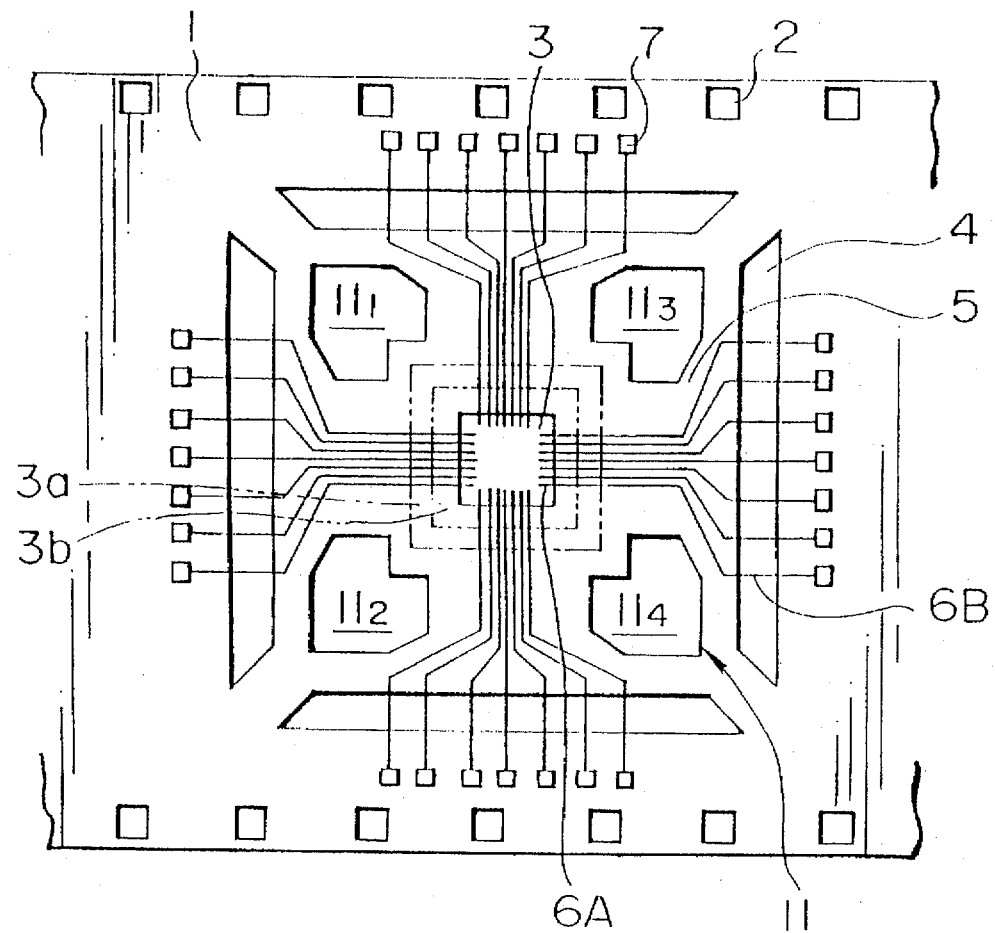
Figure 4B:
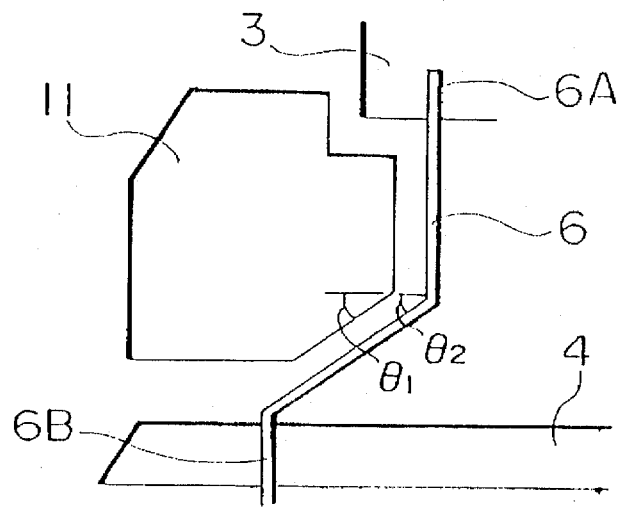

FIGS. 4A and 4B show the first embodiment of the present invention. Leads 6 extending from a device hole 3, in which a semiconductor chip is to be mounted, to each outer lead hole 4 are arranged in a distance corresponding to ⅓ or more the width of the suspender 5, i.e., a distance between the device hole 3 and each outer lead hole 4 at the same pitch as that of electrodes of the semiconductor chip. The wiring is formed so as to connect the trailing ends of the leads 6 to outer leads 6B. By this wiring technique, spaces are formed in corner portions in the suspender 5 as four corner slits 11 denoted by reference numerals $11_1$, $11_2$, $11_3$, and $11_4$. The shape of each slit is defined such that the shape at the device hole 3 side is formed to be similar to that of the device hole, and the remaining sides are formed along the corresponding leads 6, as shown in FIG. 4B. Particularly, when the outermost lead 6 is to be connected to the corresponding outer lead 6B in the outer lead hole 4 at an angle of $\theta_2$, an angle $\theta_1$ of the corresponding side of each corner slit 11 is set at $\theta_2=\theta_1$.

Figure 5:
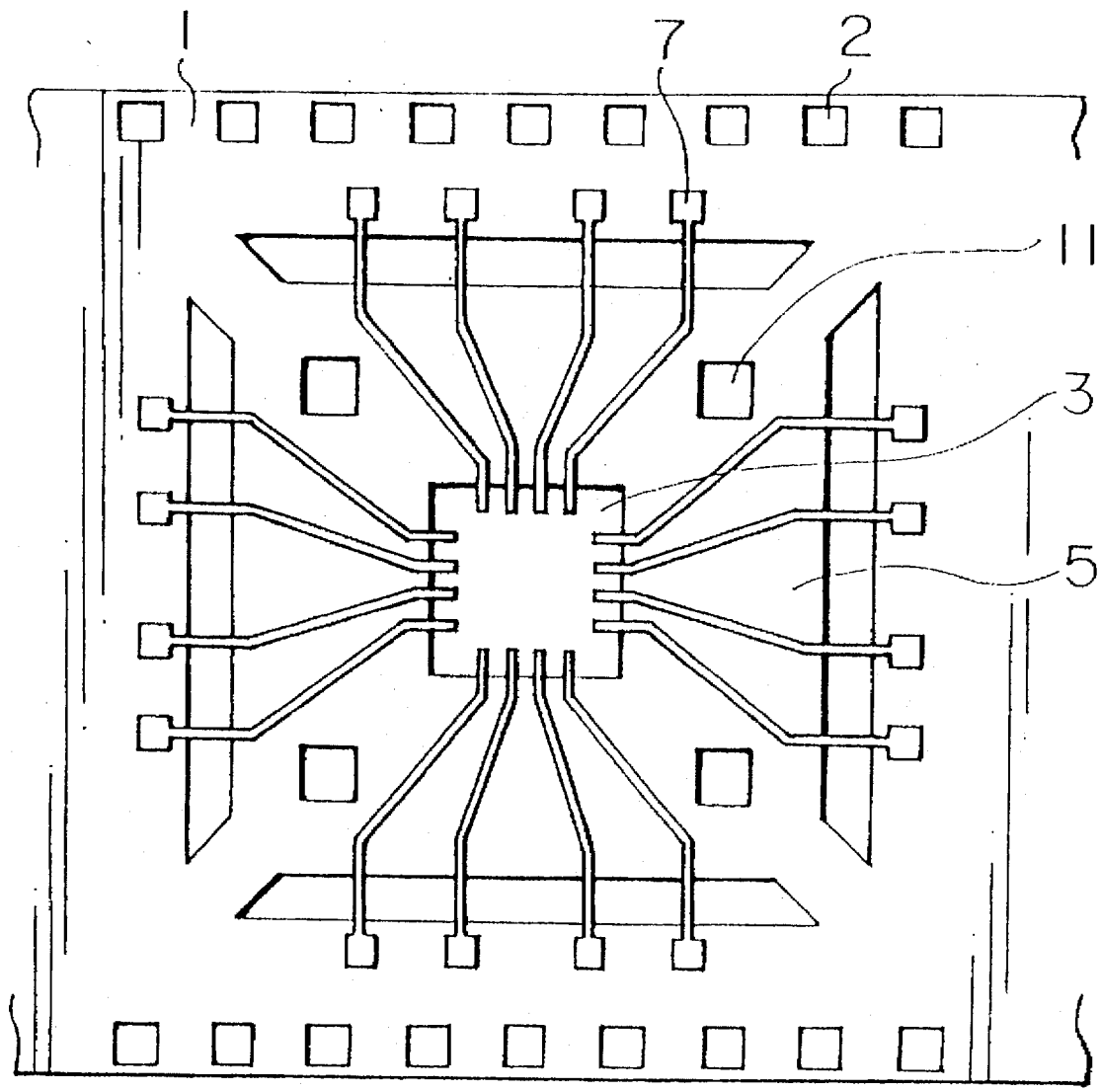
FIG. 5 is a schematic plan view showing a deformation example of the first embodiment.

As shown in FIG. 5, the slits 11 may be formed by the conventional wiring technique. In this case, when, e.g., the number of leads 6 or the size of the device hole 3 is increased, the positions of the corner slits 11 are often required to move because the corner slits 11 are formed to solve various problems in resin sealing. As a result, it is difficult to form common corner slits 11.

In contrast to this, the corner slits 11 as shown in FIG. 4B are formed. As a result of evaluating a minimum area of each corner slit 11, it is found that an effect can be obtained when the area is 3% or more the area of the outer shape of the mold upon resin sealing. When each common slit having a required area is formed along the two outermost leads of leads having the maximum number, the slit can be most effectively common in accordance with a change in size of each device hole represented by reference numeral 3a or 3b which is indicated by a chain double-dashed line in FIG. 4A, or a change in the number of leads. With this arrangement, when the corner slits 11 are to be formed using a punching mold, the cost of molds corresponding to the number of packages which use the common corner slits can be decreased.

Figure 6:
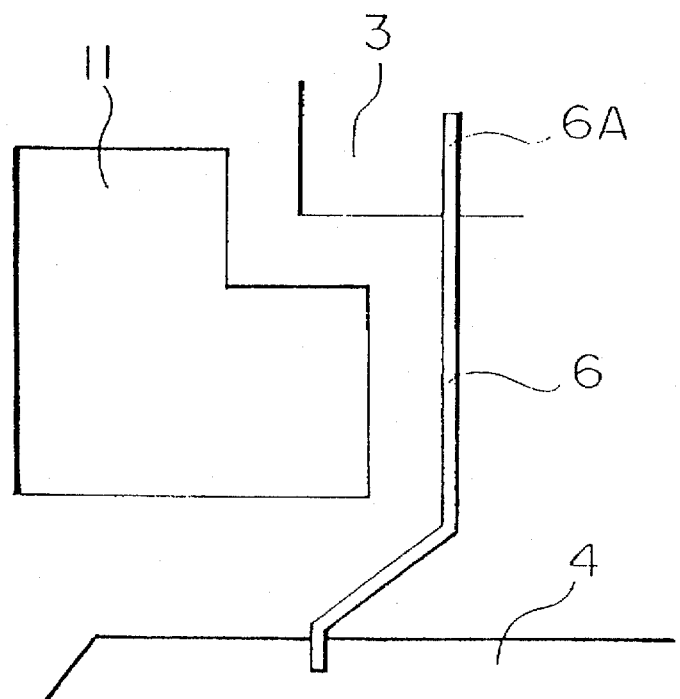
FIG. 6 is a partial enlarged plan view showing the second embodiment of the present invention.

The second embodiment will be described below with reference to FIG. 6. This embodiment is applied to a case wherein the number of package leads 6 of packages which use the common corner slits is predetermined, and the angle of the corresponding side of the slit need not be set.

Figure 7:
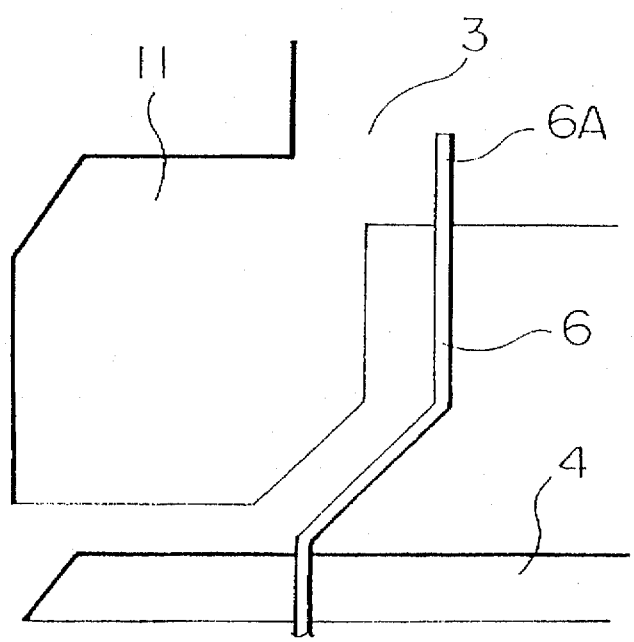
FIG. 7 is a partial enlarged plan view showing the third embodiment of the present invention.

The third embodiment, as shown in FIG. 7, is applied to a case wherein each corner slit 11 is formed integrally with a device hole 3 to promote the vertical flow of a sealing resin.

Figure 8:
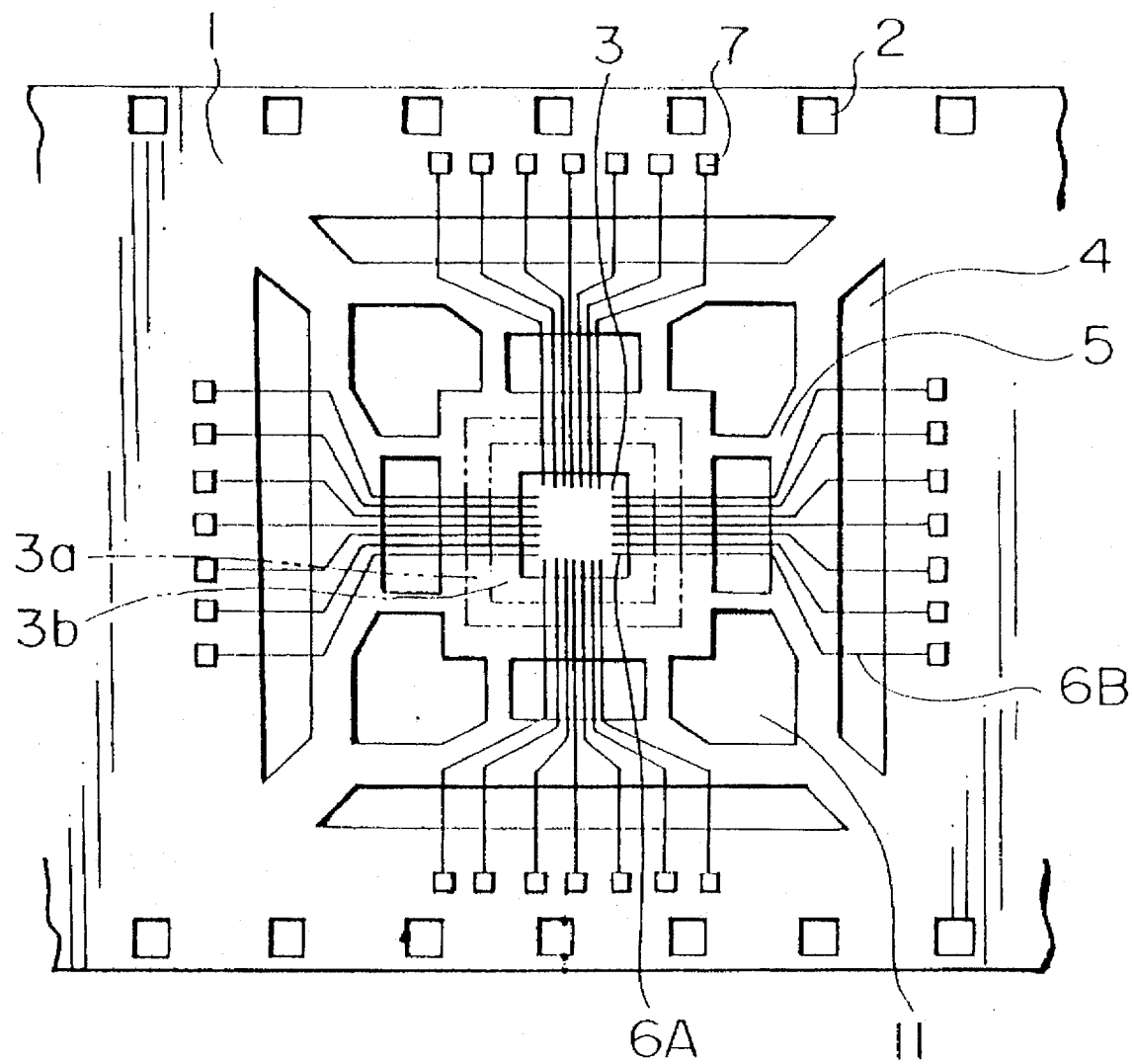
FIG. 8 is a schematic plan view showing the fourth embodiment of the present invention.

The fourth embodiment will be described with reference to FIG. 8. In addition to the corner slits 11 described in the first, second, and third embodiments, side slits 18 are formed under a lead wiring. In FIG. 8, the side slits 18 are separated from the corner slits 11, but the side slits 18 may be formed integrally with the corner slits 11. Each side slit 18 is desirably formed in a region wherein leads 6 are arranged at the same pitch as that of electrode pads. This is because, if the side slit 18 is present at inclined portions of the leads 6, the leads 6 are bent or hang down, causing a tape defect. That is, the side slits 18 can be formed to an extent which does not cause any defect.

As described above, the corner slits 11 are formed in the suspender 5. When the transfer mold method is to be performed on, e.g., a film carrier tape, required corner slits as resin sealing ports may be widen up to, e.g., the transverse portions of the outer lead holes.

Although the corner slits 11 are formed in the four corners of the suspender 5, the corner slit 11 may be formed in at least one corner. However, when leads are cut off at the outer lead holes 4 as in mounting of a film carrier package free from resin sealing on a board, and TAB in QFP, a vibration generated upon cutting the leads is transmitted to joint portions between the electrode pads of the semiconductor chip and the inner leads 6A, or a stress generated by deformation of part of the suspender 5 upon cutting acts on the joint portions. The vibration and stress may cause to peel or cut the leads 6. In order to remove this stress, it is effective to equally provide the corner slits 11 having a desired shape at four portions.

What we claimed is:

1. A film carrier tape for use in Tape Automated Bonding (TAB), said film carrier tape comprising a base film having a device hole and outer lead holes, a suspender defined between said device hole and said outer lead holes, and sprocket holes for connecting electrode pads of a semiconductor chip to be placed at said device hole; and a lead wiring of a desired shape formed on said base film, a corner slit being formed in at least one of four corner portions of said suspender so as to enable vertical communication between said lead wiring and said semiconductor chip, wherein:

said lead wiring extends from the device hole to each of the outer lead holes and is formed in a range of at least ⅓ a width of said suspender so that a distance between the device hole and an outer lead hole is at the same pitch as that of said electrode pads of said semiconductor chip, and the corner slit has a heartlike shape to enlarge the corner slit from a side of a sprocket hole toward a side of the device hole.

2. The tape according to claim 1, further comprising a side slit formed in said base film under said lead wiring on said suspender so as to enable vertical communication between said lead wiring and said semiconductor chip.

3. The tape according to claim 1, further including a resin sealing, wherein a total area of the corner slit is at least 3% of an area of a mold upon said resin sealing.

4. The tape according to claim 1, further including a resin sealing, wherein a total area of the corner slit is at least 3% of an area of a mold upon said resin sealing.

5. The tape according to claim 1, wherein a shape of said heart-like corner slit at the side of the device hole is similar to that of the device hole.

6. The tape according to claim 1, wherein a side of the corner slit of the heart-like shape is formed parallel to a pattern wire from inner leads to outer leads.

7. The tape according to claim 1, wherein the corner slit is formed as part of the device hole.

* * * * *